(12) United States Patent
Struven

(10) Patent No.: US 6,209,555 B1
(45) Date of Patent: Apr. 3, 2001

(54) SUBSTRATE CASSETTE FOR ULTRASONIC CLEANING

(75) Inventor: Kenneth C. Struven, San Carlos, CA (US)

(73) Assignee: Imtec Acculine, Inc., Sunnyvale, CA (US)

( * ) Notice: Subject to any disclaimer, the term of this patent is extended or adjusted under 35 U.S.C. 154(b) by 0 days.

(21) Appl. No.: 09/299,990

(22) Filed: Apr. 27, 1999

(51) Int. Cl.[7] ...................................................... B08B 3/10
(52) U.S. Cl. ........................... 134/182; 134/184; 134/902; 211/41.18
(58) Field of Search .................................. 134/902, 186, 134/184, 1, 1.3, 182; 211/41.18

(56) References Cited

U.S. PATENT DOCUMENTS

| | | | |
|---|---|---|---|
| 3,610,613 | * 10/1971 | Worden | 134/902 |
| 5,593,505 | * 1/1997 | Erk et al. | 134/184 |
| 5,715,851 | * 2/1998 | Jung et al. | 134/184 |
| 5,908,042 | * 6/1999 | Fukunaga et al. | 134/902 |
| 6,098,643 | * 8/2000 | Miranda | 134/186 |

FOREIGN PATENT DOCUMENTS

| | | | |
|---|---|---|---|
| 5-13400 | * 1/1993 | (JP) | 134/902 |
| 5-47738 | * 2/1993 | (JP) | 134/902 |

\* cited by examiner

*Primary Examiner*—Frankie L. Stinson
(74) *Attorney, Agent, or Firm*—Harris Zimmerman

(57) ABSTRACT

A cassette for supporting electrical component substrates in a megasonic processing bath includes a pair of end panels spaced apart longitudinally, a pair of side rails extending longitudinally along opposed sides of the substrate cassette, and at least one bottom support extending between lower portions of the end panels. The supports include a plurality of shallow channels extending laterally therein and spaced regularly therealong to receive edge portions of the substrates. The side rails and bottom supports of the cassette are all formed of plate components that are dimensioned to transmit the maximum amount of the megasonic energy projected into the processing bath, so that the components do not cause sound-shadowing of the substrates supported in the cassette. The side rails and bottom supports are formed of narrow plates having a thickness equal to an integer multiple (i.e., 1, 2, 3, etc.) or an even fractional (i.e., ½, ¼, etc.) number of wavelengths of the ultrasonic energy in the material that comprises the side rails and bottom supports. The wavelength matching dimensions of the structural components couples the sound energy into the quartz to a maximum extent, and it is transmitted through the quartz to the liquid bath as well as to the substrates supported by the structural components. In addition, the narrow plate components may be tilted to be non-horizontal to shed detrimental bubbles that may form in the liquid of the megasonic bath.

9 Claims, 4 Drawing Sheets

SUBSTRATE CASSETTE FOR ULTRASONIC CLEANING

BACKGROUND OF THE INVENTION

This invention relates to substrate holders, and more particularly to a substrate cassette for optimizing megasonic cleaning of substrates supported therein.

In the production and manufacture of electrical components, it is a recognized necessity to be able to clean, etch or otherwise process substrates to an extremely high degree of cleanliness and uniformity. Various cleaning, etching, or stripping processes may be applied to the substrates a number of times in conjunction with the manufacturing steps to remove particulates, predeposited layers or strip resist, and the like.

One cleaning process that is often employed involves ultrasonic cleansing; that is, the application of high amplitude ultrasonic energy to the substrates in a liquid bath. More specifically, the ultrasonic energy is generally, but not limited to, the range of 0.60–1.00 MHz, and the process is termed megasonic cleaning. The liquid bath may comprise deionized water, standard cleaning solvents, dilute HF, sulfuric, phosphoric, organic strip, or the like. The amplitude and the length of time of application of the sonic energy are generally well known in the prior art.

Substrates are typically processed in batches, and likewise are generally cleaned in batches. For example, it is known in the prior art to support 20–50 substrates in a holder immersed in a megasonic bath for cleaning purposes. The holder (hereinafter, substrate cassette) maintain the substrates in a parallel array in regular spacing. It is known that megasonic energy is highly directional, and typically tends to impinge on the substrates in the cassette in an uneven manner. That is, the structural components of the substrate cassette comprise obstacles that block direct line-of-sight application of the sonic energy to some portions of some of the substrates, thereby reducing the effectiveness of the megasonic cleaning, etching, or stripping process and ultimately leading to a reduction in yield of those substrates.

One approach to overcoming this problem involves rotation of the substrates in the megasonic bath to expose all surface areas to sonic energy in a more uniform manner. Ironically, this tactic requires a cassette that is larger and more intricate than the stationary substrate cassettes, thereby blocking more of the megasonic energy. Moreover, the edge supports of the rotating substrates create friction and abrasion of the substrate edge surfaces, increasing the possibility of damage to the substrates as they are being cleaned or otherwise processed.

It is also possible to physically move the megasonic transducers in an attempt to eliminate the shadowed areas of the substrates in the cassette. This approach also leads to similar drawbacks and complexities that are not amenable to mass production and reliable results.

SUMMARY OF THE INVENTION

The present invention generally comprises a substrate cassette that is designed to support a plurality of substrates during megasonic cleaning, etching, or stripping. A salient aspect of the cassette is that it couples the megasonic energy from the cleaning or processing bath into the substrates supported in the cassette, thereby eliminating sonic-shadowed areas of the substrates and maximizing the cleaning, etching, or stripping performance of the megasonic bath.

The substrate cassette includes a pair of end panels spaced apart longitudinally, and a plurality of longitudinal supports extending between the end panels. The supports include a pair of side rails extending longitudinally along opposed sides of the cassette, and at least one bottom support extending between lower portions of the end panels. The supports are each provided with a plurality of shallow channels extending laterally therein and spaced regularly therealong, each channel disposed to receive an edge portion of a substrate. The channels of all the longitudinal supports are disposed in serial registration, so that a plurality of substrates may be supported in parallel, spaced apart fashion generally perpendicular to the longitudinal axis of the cassette.

The longitudinal supports and channels of the substrate cassette are all formed of plate components that are dimensioned to transmit the maximum mount of the megasonic energy projected into the cleaning, etching, or stripping bath, so that the components do not cause sonic-shadowing of the substrates supported in the cassette. In particular, the side rails and bottom supports are formed of narrow plates having a thickness equal typically to one wavelength of the ultrasonic energy in the material that comprises the side rails and bottom supports. Alternatively, the thickness dimension may be comprised from an integer multiple (i.e., 1, 2, 3, etc.) or an even fractional (i.e., ½, ¼, etc.) number of wavelengths. In addition, the channels of the bottom supports are dimensioned in this particular example to have a depth equal to one-half wavelength of the ultrasound energy. For example, if the side rails and bottom supports are formed of quartz plates, and the megasonic frequency is 0.95 MHz, the plate thickness is approximately 0.238 inches (6.05 mm), and the channels are 0.119 inches (3.02 mm) deep. The wavelength matching dimensions of the structural components couples the sound energy into the quartz to a maximum extent, and it is transmitted through the quartz to the liquid bath as well as into the substrates supported by the structural components. Thus sonic-shadows are eliminated, and the megasonic cleaning, etching, or stripping effect is more uniform across the surfaces of the substrates.

In addition, the narrow plate components may be tilted slightly so that their upper and lower surfaces are not horizontal. This arrangement permits any bubbles that are formed by the megasonic energy in the liquid to slide off the lower surfaces and rise to the surface of the bath, thereby eliminating the detrimental acoustic effects of the bubbles with respect to the megasonic energy transmission performance.

DESCRIPTION OF THE PREFERRED EMBODIMENT

Figure 1:
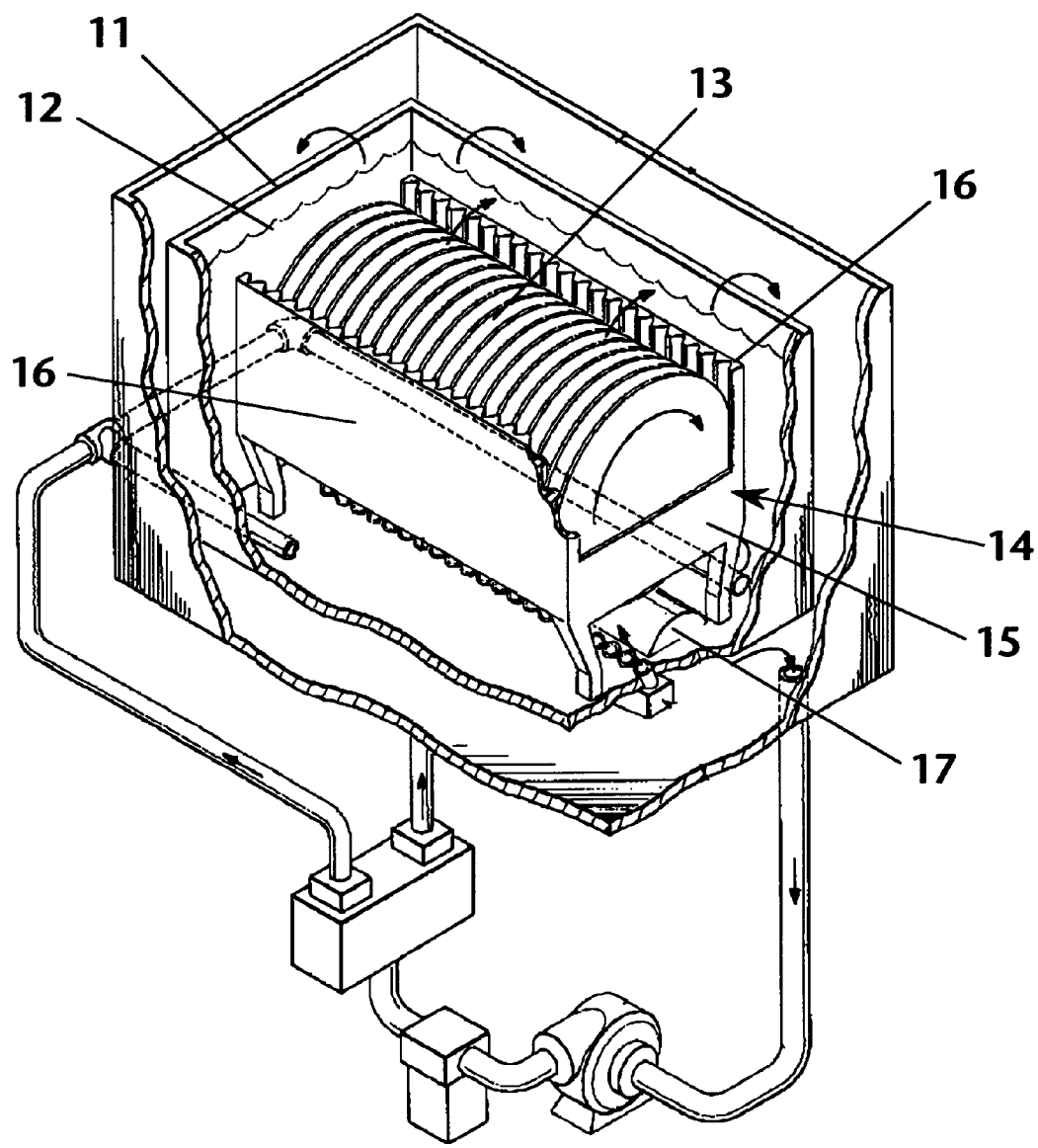
FIG. 1 is a perspective view of a typical prior art megasonic cleaning or processing bath for substrates.

The present invention generally comprises a substrate cassette that is designed to support a plurality of substrates during immersion in a megasonic cleaning, etching, or stripping bath. To highlight the innovative aspects of the invention, and for purposes of comparison and contrast, a typical prior art megasonic cleaning bath is shown in FIG. 1. In this apparatus, a tank 11 contains a cleansing bath 12, and plurality of substrates 13 are immersed in the bath 12. The substrates 13 are supported in a substrate cassette 14. The substrate cassette includes end plates 14 and side panels 16 of substantial size and mass, as well as a bottom panel (not shown). A megasonic transducer 17 within the assembly projects ultrasonic acoustic energy into the bath 12 to enhance the cleansing effect of the recirculating bath liquid. The sizable structural components of the cassette 14 cause sound-shadowing of portions of the substrates supported therein, reducing the effectiveness of the megasonic energy. In this example, the substrates are rotated by jets of bath liquid in an attempt to avoid sound-shadowing. However, the cassette must be specially designed to support the substrates during rotation, paradoxically causing the cassette to be more massive and intrusive in the sound projection pattern.

Figure 2:
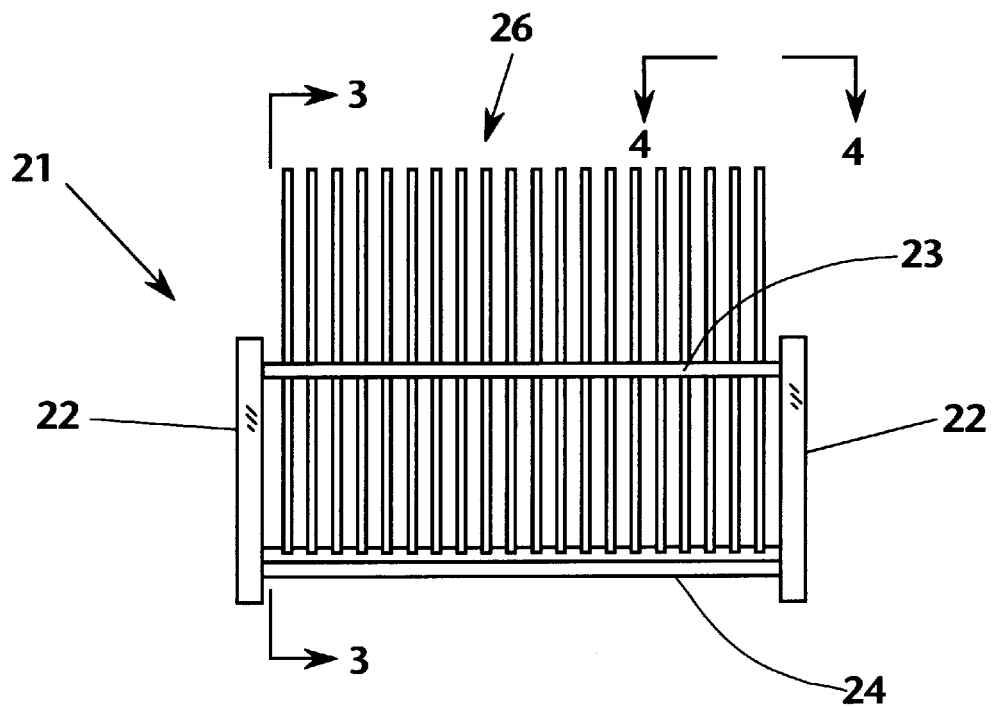
FIG. 2 is a side elevation of the electrical component substrate cassette of the present invention, shown loaded with substrates.
Figure 3:
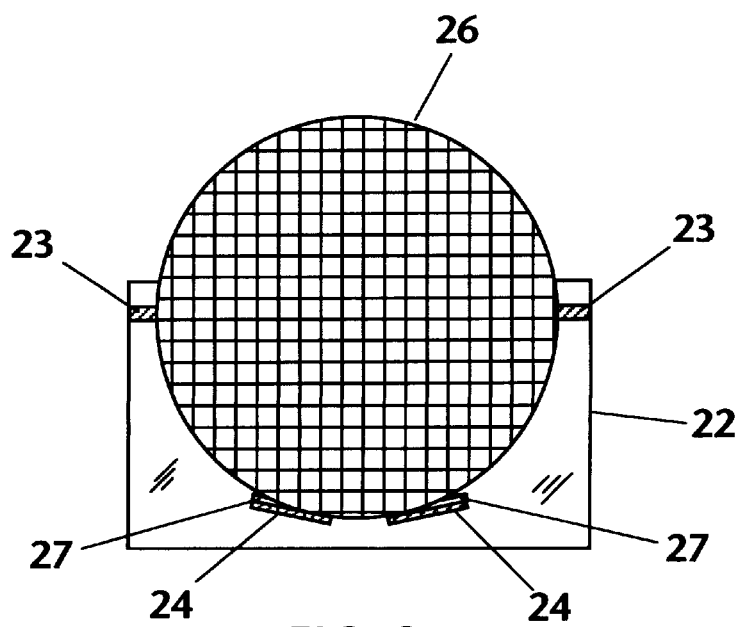
FIG. 3 is a cross-sectional end view of the substrate cassette, taken along line 3—3 of FIG. 2.

With regard to FIGS. 2 and 3, the substrate cassette 21 of the invention includes a pair of end panels 22 disposed in longitudinally spaced, parallel relationship. A pair of side rails 23 extend longitudinally between upper side portions of the end panels 22 and are fixedly secured thereto. The cassette 21 also includes at least one bottom support 24 extending between lower medial portions of the end panels 22. In the preferred embodiment, a pair of bottom supports 24 are provided, and the side rails and bottom supports are disposed in bilateral symmetrical relationship. The lateral spacing between the side rails 23 admits therebetween the diametrical dimension of a plurality of electrical component substrates 26, and the vertical spacing between the side rails and the bottom supports 24 accommodates a sufficient portion of the substrates 26 to securely retain the substrates while permitting removal of the substrates by vertical translation from the cassette 21.

Figure 5:
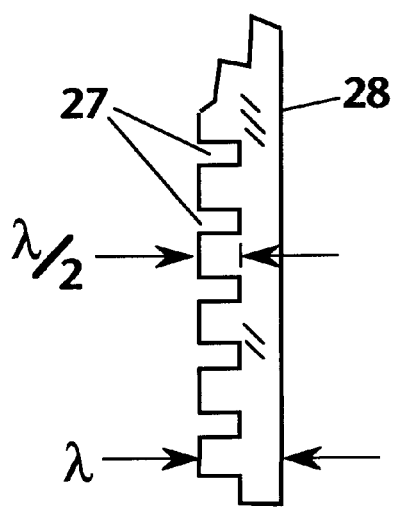
FIG. 5 is a magnified, partial side view of a bottom support of the substrate cassette shown in FIGS. 2–4.
Figure 6:
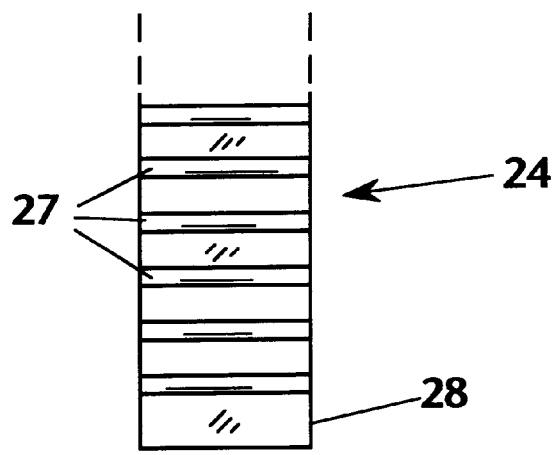
FIG. 6 is a top view of a bottom support of the substrate cassette shown in FIGS. 2–5.

The side rails 23 and bottom supports 24 are all formed of plate components that are dimensioned to transmit the maximum amount of the megasonic energy projected into the substrate-processing bath, so that the components do not block the megasonic energy to any significant extent. With regard to FIGS. 5 and 6, each bottom support 24 is comprised of a longitudinally extending, narrow, thin plate 28. The plate 28 is provided with a plurality of shallow channels 27 extending laterally therein and spaced longitudinally therealong, each channel having sufficient width to accommodate the thickness of one substrate 26. The thickness of the plate 28 is dimensioned to be equal to the wavelength of the megasonic energy in the material which forms the plate 28. For example, the plate 28 may be fabricated of pure quartz; if the megasonic energy has a frequency of 0.95 MHz, one wavelength in quartz is approximately 0.238 inches (6.05 mm), and the thickness of plate 28 is 0.238 inches. Other megasonic frequencies, materials, and appropriate plate thicknesses may be chosen by those skilled in the art.

In addition, the channels 27 are dimensioned with a depth equal to one-half wavelength of the megasonic energy. In the given example, the channels are 0.119 inches (3.02 mm) deep. Matching the thickness of the plate 28 to the wavelength of the megasonic energy maximally couples the acoustic energy into the plate 28, so that it passes through the plate with little attenuation and impinges on the substrates 26. In this manner sound-shadowing of the substrates is reduced to an insignificant effect. Likewise, the half-wavelength depth of the channels maximally couples the acoustic energy through that portion of the plate to be conducted and transmitted to the substrates 26.

Figure 4:
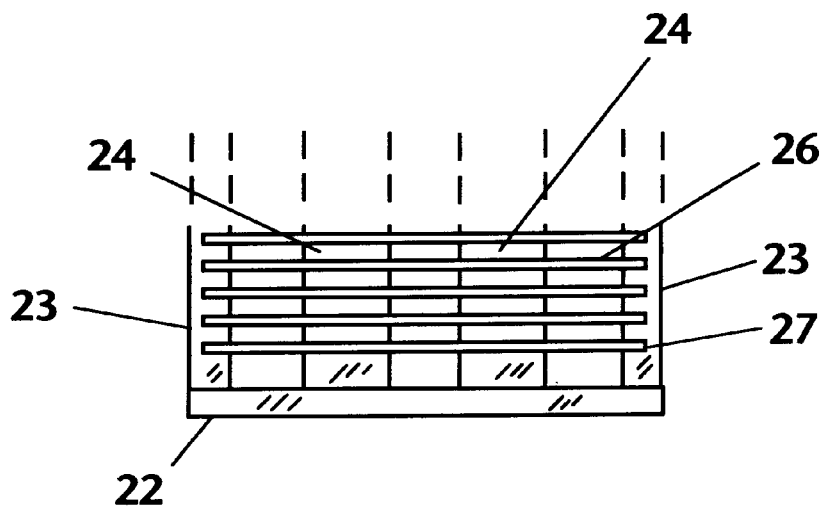
FIG. 4 is a partial top view of the substrate cassette, taken along line 4—4 of FIG. 2.
Figure 7:
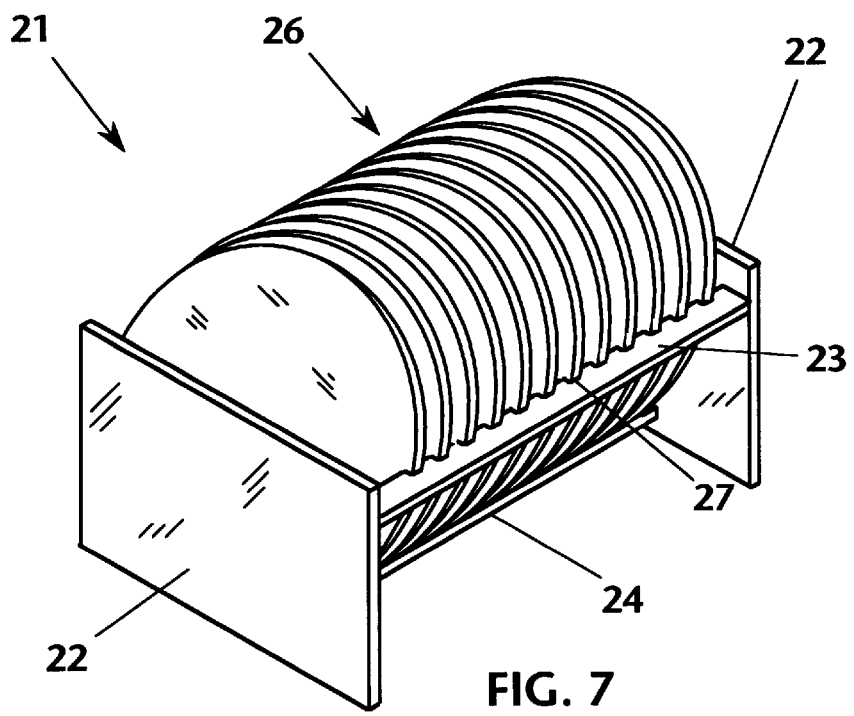
FIG. 7 is a perspective view of the substrate cassette of the present invention, shown loaded with substrates.
Figure 8:
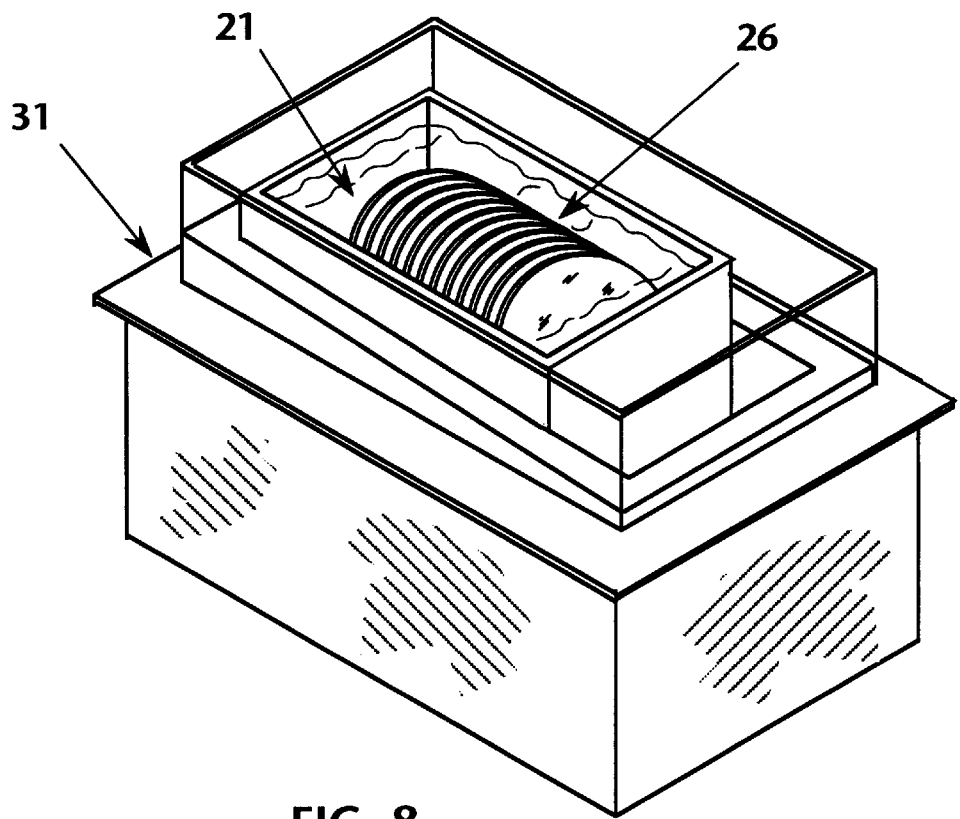
FIG. 8 is a perspective view of the substrate cassette of the present invention, shown loaded with substrates and immersed in a typical megasonic cleaning or processing bath.

With regard to FIGS. 4 and 7, the side rails 23 are also formed of similar plate components having a vertical thickness equal to the wavelength of the megasonic energy of the cleaning bath, and also having channels 27, similar to the channels 27 in the bottom supports, to engage the edge portions of the substrates 26. Indeed, the channels of the side rails are aligned with the channels 27 of the bottom supports 24 to support each substrate 26 in generally vertical alignment. In a typical embodiment of the cassette, there may be a capacity for 25–50 substrates with an inter-substrate spacing of 3/16 inch to 1/4 inch. The substrate cassette 21 may be employed to support a plurality of substrates 26 in a megasonic processing bath 31, as shown in FIG. 8, and to facilitate placement and removal of the substrates in the megasonic cleaning bath in a batch process.

In addition, the narrow plate components of the bottom supports and side rails may be tilted slightly (in the range of 0.5°–5°) so that their upper and lower surfaces are not horizontal. This arrangement, shown in FIG. 3 with respect to the bottom supports 24, permits any bubbles that are formed in the megasonic processing bath to slide off the lower surfaces and rise to the surface of the bath, thereby eliminating the detrimental acoustic effects of the bubbles with respect to the megasonic energy transmission performance.

The generally open construction of the substrate cassette 21 also permits a greater latitude in the placement of the megasonic transducer array with respect to the processing bath. Although the transducer is typically placed externally on the bottom of the bath tank and disposed to radiate upwardly through the tank bottom, the invention makes possible the placement of a megasonic transducer on a side wall of the bath tank, instead of or in conjunction with the typical bottom array. The open construction also minimizes the formation of interference patterns in the acoustic energy distribution throughout the bath, which can otherwise diminish the uniformity of the megasonic energy impinging on some portions of some substrates.

The foregoing description of the preferred embodiment of the invention has been presented for purposes of illustration and description. It is not intended to be exhaustive or to limit the invention to the precise form disclosed, and many modifications and variations are possible in light of the above teaching without deviating from the spirit and the scope of the invention. The embodiment described is selected to best explain the principles of the invention and its practical application to thereby enable others skilled in the art to best utilize the invention in various embodiments and with various modifications as suited to the particular purpose contemplated. It is intended that the scope of the invention be defined by the claims appended hereto.

What is claimed is:

1. A substrate cassette for a megasonic processing bath having a megasonic transducer projecting acoustic energy through a liquid bath, including:

a pair of side rails spaced apart laterally and extending longitudinally in parallel relationship;

at least one bottom support extending longitudinally and disposed below said pair of side rails and intermediate thereof;

a pair of end structures, each end structure joining like ends of said pair of side rails and said at least one bottom support;

means for coupling said acoustic energy into and through said at least one bottom support to impinge on substrates supported in said substrate cassette, said megasonic transducer operates at a predetermined frequency, and said at least one bottom support is formed of a narrow plate component, and said plate component includes a thickness dimension equal to a integer multiple (i.e., 1, 2, 3, etc.) or an even fractional (i.e., ½, ¼, etc.) number of wavelengths of the megasonic acoustic energy in the material which forms the plate component.

2. The substrate cassette of claim 1, further including a first plurality of shallow channels formed in said at least one bottom support, said channels being spaced apart longitudinally, each channel disposed to engage a lower edge portion of one substrate.

3. The substrate cassette of claim 2, wherein the depth of each of said plurality of channels is equal to an integet multiple (i.e., 1, 2, 3, etc.) or an even fractional (i.e., ½, ¼, etc.) number of wavelengths of the megasonic acoustic energy in the material which forms the plate component.

4. The substrate cassette of claim 3, wherein said pair of side rails are each formed of a narrow plate component, and said plate component includes a thickness dimension equal to integer multiple (i.e., 1, 2, 3, etc.) or an even fractional (i.e., ½, ¼, etc.) number of wavelengths of the megasonic acoustic energy in the material which forms the plate component.

5. The substrate cassette of claim 4, further including a second plurality of shallow channels formed in said pair of side rails, said second channels being spaced apart longitudinally, each of said second channels disposed to engage a side edge portion of one substrate.

6. The substrate cassette of claim 5, wherein the depth of each of said second plurality of channels is equal to integer multiple (i.e., 1, 2, 3, etc.) or an even fractional (i.e., ½, ¼, etc.) number of wavelengths of the megasonic acoustic energy in the material which forms the side rails.

7. The substrate cassette of claim 1, further including a pair of bottom supports spaced apart laterally.

8. The substrate cassette of claim 7, wherein said plate components of said bottom supports each include upper and lower surfaces, and means for disposing said upper and lower surfaces in a non-horizontal orientation.

9. The substrate cassette of claim 8, wherein said means for disposing includes canting said plate components in a range of 0.5°–5° from horizontal about a longitudinal axis.

* * * * *